United States Patent
Garni et al.

(10) Patent No.: US 9,263,100 B2
(45) Date of Patent: Feb. 16, 2016

(54) BYPASS SYSTEM AND METHOD THAT MIMICS CLOCK TO DATA MEMORY READ TIMING

(71) Applicant: FREESCALE SEMICONDUCTOR, INC., Austin, TX (US)

(72) Inventors: Bradley J. Garni, Austin, TX (US); Huy Van V. Pham, Cedar Park, TX (US); Glenn E. Starnes, Austin, TX (US); Mark Jetton, Austin, TX (US); Thomas W. Liston, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 76 days.

(21) Appl. No.: 14/093,123

(22) Filed: Nov. 29, 2013

(65) Prior Publication Data
US 2015/0155017 A1 Jun. 4, 2015

(51) Int. Cl.
| | |
|---|---|
| G11C 7/10 | (2006.01) |
| G11C 29/50 | (2006.01) |
| G11C 29/02 | (2006.01) |
| G11C 7/06 | (2006.01) |
| G11C 7/22 | (2006.01) |

(52) U.S. Cl.
CPC *G11C 7/10* (2013.01); *G11C 7/065* (2013.01); *G11C 7/1051* (2013.01); *G11C 7/22* (2013.01); *G11C 7/222* (2013.01); *G11C 29/023* (2013.01); *G11C 29/50012* (2013.01)

(58) Field of Classification Search
CPC ........ G11C 7/22; G11C 7/1051; G11C 7/065; G11C 29/50012; G11C 29/023
USPC .............. 365/189.05, 205, 207, 201; 714/6.2, 714/6.1, 54, 718
See application file for complete search history.

(56) References Cited

U.S. PATENT DOCUMENTS

| | | | | |
|---|---|---|---|---|
| 5,432,747 A * | 7/1995 | Fuller | ...................... | G11C 7/12 365/189.05 |
| 5,471,428 A * | 11/1995 | Baroni | ..................... | G11C 7/22 365/200 |
| 5,661,693 A * | 8/1997 | Akioka | .................. | G11C 7/065 365/189.05 |
| 5,761,215 A * | 6/1998 | McCarthy | ........ | G01R 31/31858 714/726 |
| 5,875,135 A * | 2/1999 | Patwardhan | ........... | G11C 29/02 365/194 |
| 5,974,499 A * | 10/1999 | Norman | ................. | G11C 16/10 711/103 |
| 6,101,618 A * | 8/2000 | McClure | ................ | G11C 29/02 714/25 |
| 6,636,998 B1 * | 10/2003 | Lee | ........................ | G11C 29/12 365/189.07 |
| 6,754,094 B2 * | 6/2004 | McClure | ................ | G11C 29/50 365/145 |
| 7,093,083 B1 * | 8/2006 | Matthews | ............ | G11C 7/1039 365/189.04 |

(Continued)

*Primary Examiner* — Amir Zarabian
*Assistant Examiner* — Roberto Mancera
(74) *Attorney, Agent, or Firm* — Gary Stanford; Huffman Law Group, PC

(57) ABSTRACT

A bypass system and method that mimics read timing of a memory system which includes a self-timing circuit and a sense amplifier. When prompted, the self-timing circuit initiates the sense amplifier to evaluate its differential input. The bypass system includes a memory controller that is configured to provide a bypass enable, to prompt the self-timing circuit, and to disable normal read control when a bypass read operation is indicated. A bypass latch latches an input data value, converts the input data value into an input complementary pair, and provides the complementary pair to the differential input of the sense amplifier. The sense amplifier, when initiated, evaluates the input complementary pair after its self-timing period and provides an output data value. The bypass latch and self-timing circuit may operate synchronous with a read clock in a read domain of the memory for more accurate memory read timing.

20 Claims, 2 Drawing Sheets

(56) References Cited

U.S. PATENT DOCUMENTS

| | | | |
|---|---|---|---|
| 7,499,347 B2* | 3/2009 | Chen | G11C 7/14 365/194 |
| 7,603,603 B2 | 10/2009 | Dubey | |
| 7,694,199 B2* | 4/2010 | Whetsel | G01R 31/31715 714/726 |
| 7,800,974 B2* | 9/2010 | Zhang | G06F 12/0855 365/194 |
| 8,009,493 B2* | 8/2011 | Na | G11C 29/02 365/149 |
| 9,003,255 B2* | 4/2015 | Kohli | G11C 11/4063 365/200 |
| 2003/0222720 A1* | 12/2003 | Sumita | G06F 1/10 331/16 |
| 2007/0002625 A1* | 1/2007 | Park | G11C 16/08 365/185.12 |
| 2011/0051541 A1* | 3/2011 | Banno | G11C 29/06 365/201 |
| 2012/0134226 A1* | 5/2012 | Chow | G11C 7/08 365/207 |
| 2013/0272072 A1* | 10/2013 | Cummings | G11C 29/56004 365/189.02 |

* cited by examiner

BYPASS SYSTEM AND METHOD THAT MIMICS CLOCK TO DATA MEMORY READ TIMING

BACKGROUND OF THE INVENTION

1. Field of the Invention

The present disclosure relates generally to memory systems, and more specifically, to a bypass system and method that performs a bypass process that mimics clock to data memory read timing, including mimicking timing in the read domain of a multiport register file.

2. Description of the Related Art

A bypass system may be used for testing on-chip timing to determine whether data or information received from a memory has arrived at a destination within a target time frame. In a typical bypass operation, data are provided to the memory interface and provided back out to a destination without actually writing data into the memory array or reading data from the memory array. In a conventional bypass system, a simple interface, such as a set of flip-flops, buffers, latches, pass gates, or the like, conveys the input data received at the memory input port directly to the output port completely bypassing all memory functions including timing functions. The timing of the memory read process, however, has not been incorporated so that the results are not accurate.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The present inventors have recognized that conventional memory bypass configurations fail to account for normal memory timing during a bypass read operation. In many cases it is desired to match memory read clock to output timing (tcq) of a normal read operation in order to provide a more accurate timing test without accessing the memory array. The present inventors have therefore developed a bypass system and method that performs a synchronous pseudo-write-through operation that mimics clock to data timing of a normal read operation. Many systems are configured with a multiple port (or multiport) register file (e.g., 2-port register file) with separate and independent read and write domains. A bypass system and method as described herein shadows a write operation with a provided test data value while operating in the read domain to retrieve the test data value using the timing of a normal read operation. In this manner, the bypass system provides more accurate timing without accessing the memory array.

Figure 1:
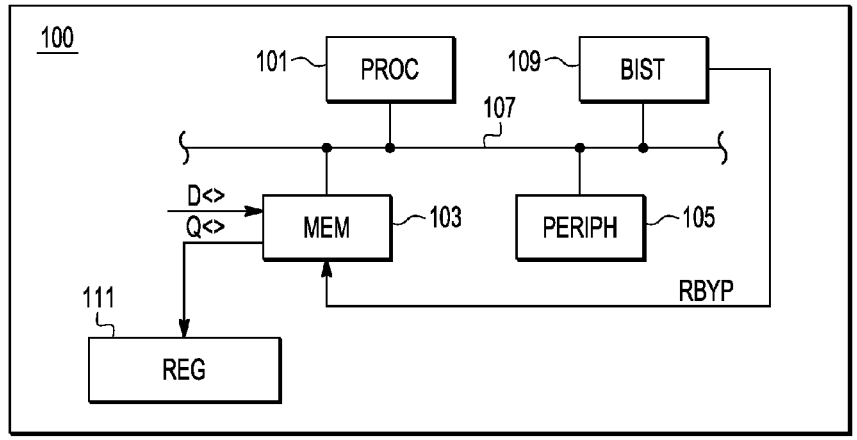
FIG. 1 is a simplified block diagram of a device including a bypass system implemented according to one embodiment.

FIG. 1 is a simplified block diagram of a device 100 including a bypass system implemented according to one embodiment. In the illustrated embodiment, the device 100 is implemented on an integrated circuit (IC) as a system-on-a-chip (SOC) configuration, although alternative configurations are contemplated. The device 100 includes a processor 101 coupled to a memory system 103 and a peripheral interface 105 via a system interface 107. The device 100 further includes a built-in self-test (BIST) engine 109 coupled to the system interface 107 for initiating bypass operations as further described herein. The BIST engine 109 may be configured to perform other test operations, such as boundary scan operations, debug operations, calibration operations, etc. Although only one BIST engine 109 is shown, a given configuration may include any number of different BIST engines for performing various test operations.

Although not shown, in an alternative configuration the device 100 may include at least one external input/output (I/O) test interface for externally controlling test operations. The external I/O test interface may be used to control the BIST engine 109 or other test logic incorporated on the device 100.

The processor 101 may be implemented in any suitable fashion, such as a microcontroller or a central processing unit (CPU) or the like. The memory system 103 may include any combination of read-only (ROM) and random access (RAM) portions, and may include static RAM (SRAM) and dynamic RAM (DRAM) portions. In one embodiment as further described herein, the memory system 103 includes a multiple port register file with any number of ports. In one embodiment, the memory system 103 includes a 2-port register file with separate and independent read and write domains as further described herein. The peripheral interface 105 provides any number of I/O logic and circuitry for interfacing any number of peripherals or I/O devices. The system interface 107 may be implemented in any suitable manner, such as a bus system or cross-switch system or the like.

The BIST engine 109 asserts a memory read bypass signal RBYP to the memory system 103 for performing a bypass memory test operation that mimics clock to data memory read timing as further described herein. The BIST engine 109 may initiate a test routine or the like for performing test operations including initiating the bypass memory timing test. The BIST engine 109 may either provide one or more bits of a known data value, shown generally as D< >, to the memory system 103, or may select another functional block for providing the data value D< >, such as the processor 101 or the peripheral interface 105 or other functional block. In response to the RBYP, the memory system 103 performs a bypass operation that outputs a data value Q< > to the same or a different functional block, which latches the data value provided into a previously cleared memory or register or the like. For example, the data value Q< > output from the memory system 103 may be latched into a register 111, where the register 111 is located at any selected location, such as the processor 101, the peripheral interface 105, the BIST engine 109, or any other selected destination. The register 111 is initially cleared or set to a null value that is known to be different than D< >. For the bypass read operation, the output data value Q< > is a duplicate of the known input data value D< >.

The BIST engine 109 may then determine the results of the bypass read operation based on comparing the known input data value D< > with the latched data value in the register 111. If the Q< > value output from the memory system 103 is successfully latched into the register 111, then Q< >=D< > and the test is considered successful. If, however, the latched data value in the register 111 does not match D< >, then the test fails.

Figure 2:
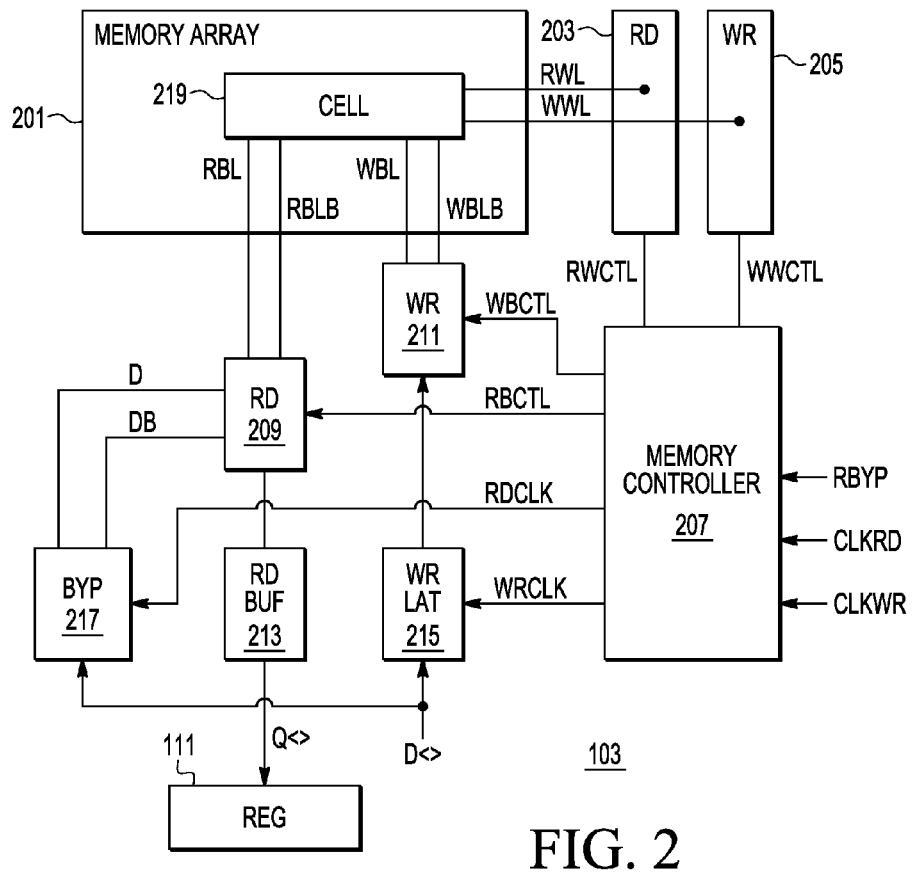
FIG. 2 is a simplified block diagram of at least a portion of the memory system of FIG. 1 implemented according to one embodiment.

FIG. 2 is a simplified block diagram of at least a portion of the memory system 103 implemented according to one embodiment. In the illustrated embodiment, the memory system 103 is configured as a 2-port register file, including a memory array 201, word line read logic 203, word line write logic 205, a memory controller 207, bit line read logic 209, bit line write logic 211, a read buffer 213, a write latch 215, and a bypass latch circuit 217. In alternative embodiments, different memory configurations are contemplated, such as a single-port register file or a multiport (3 or more ports) register file. The memory array 201 includes multiple rows and columns of bit cells including an exemplary bit cell 219. The read, write and bypass operations are described with respect to the signal bit cell 219 for a signal bit value. It is understood, however, that the data handling logic is duplicated any number of times to simultaneously read or write any suitable number of bits for each memory or bypass operation.

The word line read logic 203 accesses the bit cell 219 via a read word line RWL, the word line write logic 205 accesses the bit cell 219 via a write word line WWL, the bit line read logic 209 accesses the bit cell 219 via a "differential" pair of read bit lines RBL and RBLB for reading a data value stored in the bit cell 219, and the bit line write logic 211 accesses the bit cell 219 via a "complementary" pair of write bit lines WBL and WBLB for writing a data value into the bit cell 219. Each bit of the input data value D< > is converted to a complementary bit pair by the bit line write logic 211 for writing into a corresponding bit cell. The memory controller 207 includes both local and global control portions along with both read and write control portions.

As used herein, a "differential" bit pair refers to a pair of bits or signals with corresponding voltage levels indicative of a bit value. During a read process, the differential bit pair RBL and RBLB may initially have the same voltage level, such as both being asserted to a high voltage level. After a short period of time, the voltage of the differential bit pair RBL and RBLB separates depending upon the data bit stored in the bit cell 219 according to normal memory operation. For example, for a logic "1" value, the inverted bit line RBLB decreases to a low voltage value while the non-inverted bit line RBL remains high, and for a logic "0" value, the inverted bit line RBLB remains high whereas the non-inverted bit line decreases to the low voltage value.

In contrast, a "complementary" bit pair of bits or signals includes a first bit or signal asserted at one logic level and a second bit or signal asserted at the opposite logic level. For example, a data value "D" may be converted to a complementary bit pair D and DB in which D is non-inverted and DB is inverted relative to the original value of the data value D.

The memory controller 207 receives the RBYP signal along with a read clock CLKRD for controlling timing of read operations and a write clock CLKWR for controlling timing of write operations. The memory controller 207 provides a read clock signal RDCLK based on CLKRD to the read buffer 213 for timing operations in the read domain. The memory controller 207 provides a write clock signal WRCLK based on CLKWR to the write latch 215 for timing operations in the write domain. The memory controller 207 enables and controls the word line read logic 203 via a set of control signals RWCTL and controls the word line write logic 205 via a set of control signals WWCTL. The memory controller 207 enables and controls the bit line read logic 209 via a set of control signals RBCTL, and controls the bit line write logic 211 via a set of control signals WBCTL. The bypass latch circuit 217 asserts a complementary bit pair D and DB to the bit line read logic 209.

The known data value D<> is shown provided to inputs of the write latch 215 and to inputs of the bypass latch circuit 217. The data value D<> is used for illustrating both a normal memory write operation and a bypass read operation. For a normal memory write operation, the write latch 215 is enabled whereas the bypass latch circuit 217 is disabled. During the normal memory write operation, an input data value, such as the known input data value D<>, is latched into the write latch 215 and provided to the bit line write logic 211. The controller 207 enables the bit line write logic 211 and the word line write logic 205 to access the bit cell 219 for the write operation. The bit line write logic 211 converts the input data bit into a complementary bit pair, and asserts the bit lines WBL and WBLB accordingly. The word line write logic 205 asserts the write word line WWL to write and store the received data value D< > provided as the complementary bit pair WBL and WBLB into the bit cell 219.

During a normal read operation, the memory controller 207 enables the bit line read logic 209 and the word line read logic 203 to access the bit cell 219 for the read operation. The word line read logic 203 asserts the read word line RWL and the bit line read logic 209 senses the differential bit lines RBL and RBLB to read the data value. The bit line RBL remains asserted high and the inverted bit line RBLB goes low for a logic "1," whereas the logic levels of the differential bit lines are reversed for a logic "0." As described further below, the bit line read logic 209 incorporates a sense amplifier 309 (FIG. 3) for determining the value of the data value. The memory controller 207 includes self-timing logic 307 (FIG. 3), further described herein, which controls timing of the read operation. The RBCTL control lines includes a SENSE signal (FIG. 3), which is asserted by the self-timing logic 307 within the memory controller 207 to activate the sense amplifier 309. The sense amplifier 309 evaluates the bit lines RBL and RBLB to determine the logic value of the bit read from the bit cell 219 in response to assertion of the SENSE signal. The sense amplifier 309 outputs the data value read from the bit cell 219 to the read buffer 213, which drives its output as the output data value Q< >.

During a bypass read operation, the bypass latch circuit 217 is enabled and the write latch 215 is disabled. The input data value D<> is instead latched into the bypass latch circuit 217, which operates in a similar manner as the bit line write logic 211 by converting the input data value D< > into a complementary bit pair D and DB provided to the bit line read logic 209. The memory controller 207 disables the word line read logic 203 and further disables access logic 311 (FIG. 3) within the bit line read logic 209 driving the RBL and RBLB lines from the bit cell 219. Instead, the bypass latch circuit 217 drives internal read bit lines provided to the sense amplifier 309 within the bit line read logic 209 as further described below. The sense amplifier 309 evaluates the received complementary bit pair asserted by the bypass latch circuit 217 in response to assertion of the SENSE signal. The sense amplifier 309 outputs the read data value to the read buffer 213, which buffers its output as the output data value Q< >. Again, the read value may be provided to the register 111.

Figure 3:
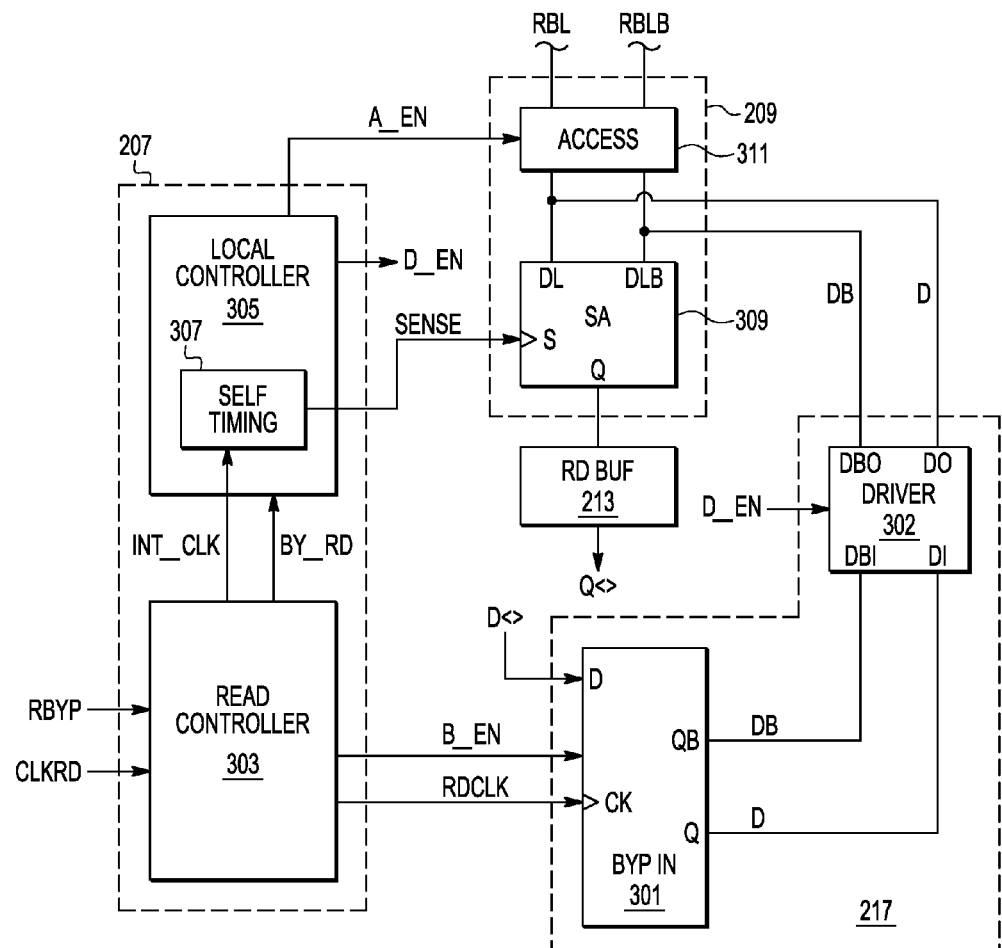
FIG. 3 is a more detailed block diagram of a bypass system implemented within the memory system of claim 2 according to one embodiment.

FIG. 3 is a more detailed block diagram of a bypass system 300 implemented according to one embodiment. In the illustrated embodiment, the bypass system 300 includes portions of the bypass latch circuit 217 and the memory controller 207 and uses the bit line read logic 209 and the read buffer 213. The bypass latch circuit 217 includes a bypass input latch 301 and a data driver 302. The RBYP and the read clock CLKRD are provided to a read controller 303 of the memory controller 207, which provides the read clock signal RDCLK and a bypass enable signal B_EN to the enable and clock inputs, respectively, of the bypass input latch 301 of the bypass latch circuit 217, and which provides an internal clock signal INT_CLK and a bypass read signal BY_RD to a local controller 305 of the memory controller 207. The bypass input latch 301 has a data input receiving the input data value D<> and provides a complementary bit pair including a non-inverted signal D and an inverted signal DB to the non-inverted input DI and inverted input DBI, respectively, of the data driver 302. The data driver 302 may be implemented in any suitable manner, such as buffers or pass gates or the like. The data driver 302 drives the complementary bit pair D and DB via its non-inverted data output DO and inverted data output DBO, respectively, to corresponding inputs of the bit line read logic 209.

The local controller 305 includes the self-timing circuit 307, which asserts the SENSE signal to a sense input of the sense amplifier 309 within the bit line read logic 209. Upon assertion of the SENSE signal, the sense amplifier 309 evaluates a differential (or complementary) bit pair received via its data bit line and inverted data bit line inputs DL and DLB, respectively, and then provides the evaluated output data to an input of the read buffer 213. The read buffer 213 outputs the buffered output data value Q< >. The local controller 305 provides a driver enable output D_EN to an enable input of the data driver 302, and provides an access enable signal A_EN to an enable input of the access logic 311 within the bit line read logic 209. The access logic 311 receives the differential pair of read bit lines RBL and RBLB and has corresponding differential pair outputs provided to the DL and DLB inputs of the sense amplifier 309.

In a normal read operation, RBYP is not asserted, and the read controller 303 negates or otherwise does not assert the B_EN signal so that the bypass input latch 301 is not enabled. During the normal read operation, the local controller 305 asserts the A_EN signal and negates the D_EN signal so that the access logic 311 conveys the differential read bit lines RBL and RBLB from the memory array 201 to the sense amplifier 309. The read controller 303 asserts the INT_CLK synchronous with the read clock CLKRD, and the self-timing circuit 307 receives INT_CLK and then waits a predetermined read period. Upon expiration of the predetermined read period, the self-timing circuit 307 asserts the SENSE signal according to normal memory read operation timing to activate the sense amplifier 309. When activated, the sense amplifier 309 evaluates its differential pair input DL and DLB and provides the result as output read data provided to the read buffer 213 to complete the normal read operation.

The access logic 311 may be implemented in any suitable manner, such as including drivers or other similar type devices (not shown) to forward the voltages of the differential bit pair RBL and RBLB from the bit cell 219 of the memory array 201 to the sense amplifier 309. Although not shown, the access logic 311 may also include select logic, such as a multiplexer (MUX) or the like, to select from among multiple bit cells according to corresponding address information.

In a bypass read operation, the BIST engine 109 (or other control logic) provides or otherwise controls a source to provide the input data value on D<>. Then the BIST engine 109 asserts the RBYP to initiate the bypass read operation. The read controller 303 responds by asserting the bypass enable signal B_EN to enable the bypass input latch 301 of the bypass latch circuit 217 and by asserting BY_RD to inform the local controller 305 of the bypass read operation. The read controller 303 further asserts the RDCLK and the INT_CLK synchronous with the read clock CLKRD. The bypass input latch 301 latches and converts the input data value to the complementary bit pair D and DB provided to corresponding inputs of the data driver 302.

The self-timing circuit 307 detects assertion of the INT_CLK and waits the predetermined read period according to normal read timing operation. The local controller 305 negates A_EN to disable the access logic 311, and asserts D_EN to enable the data driver 302. Since disabled, the access logic 311 does not drive the differential input of the sense amplifier 309. Instead, the data driver 302 drives the complementary bit pair D and DB to the DL and DLB inputs of the sense amplifier 309. Upon expiration of the predetermined read period, the self-timing circuit 307 asserts the SENSE signal to activate the sense amplifier 309, which evaluates its input differential pair DL and DLB driven by the data driver 302 and outputs the evaluated data to the read buffer 213, which outputs the bypass data as output data Q<> to complete the bypass read operation. As previously described, the output data Q<> may be provided to the latch 111 for testing the memory interface.

The bypass latch circuit 217 shadows the write latch 215, except is clocked synchronous with the read clock CLKRD in the read domain. The input data value is converted to a complementary input bit pair D and DB and driven to the differential input of the sense amplifier 309. The INT_CLK is operated according to normal read operation to initiate the predetermined read period of the self-timing circuit 307 according to normal read operation. When the predetermined read period expires, the self-timing circuit 307 asserts the SENSE signal to trigger operation of the sense amplifier 309 to evaluate the complementary bit pair provided by the data driver 302 of the bypass latch circuit 217. The sense amplifier 309 outputs the evaluated data to the read buffer 213, which outputs the data on Q<> similar to normal read operation. The output data Q<> may be provided to a selected memory location, such as the register 111 previously described. In this manner, the bypass read operation essentially duplicates or otherwise mimics normal read timing.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive logic or negative logic may be used in various embodiments in which the present invention is not limited to specific logic polarities, device types or voltage levels or the like.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A bypass system for a memory system comprising: a self-timing circuit and a sense amplifier having a differential input, wherein the self-timing circuit, after being prompted, initiates the sense amplifier after a predetermined time period to evaluate the differential input of the sense amplifier; and wherein said bypass system further comprises:
   a memory controller that is configured to provide a bypass enable when a bypass read operation is indicated;
   a bypass latch that, when enabled by said bypass enable, latches an input data value, converts said input data value into a corresponding input complementary pair, and provides said input complementary pair to the differential input of the sense amplifier; and wherein the sense amplifier, when initiated, evaluates said input complementary pair after the predetermined time period and provides an evaluated output data value indicative of said input data value.

2. The bypass system of claim 1, wherein said memory controller is further configured to prompt the self-timing circuit and to disable normal read control when the bypass read operation is indicated.

3. The bypass system of claim 1, wherein said bypass latch comprises:
an input latch having a data input receiving said input data value, an enable input receiving said bypass enable, and an output providing a corresponding complementary bit pair; and
a data driver that is configured, when enabled, to drive said corresponding complementary bit pair as said input complementary pair to the differential input of the sense amplifier.

4. The bypass system of claim 3, wherein the memory system comprises a multiport register file with separate read and write domains, and wherein said memory controller comprises:
a read controller providing a first read clock to a clock input of said input latch and providing an internal clock for activating the self-timing circuit; and
a local controller for incorporating the self-timing circuit for receiving said internal clock, wherein said local controller provides a driver enable signal to an enable input of said data driver.

5. The bypass system of claim 4, wherein said read controller receives a bypass indication signal and a second read clock, wherein said read controller asserts said first read clock and said internal clock synchronous with said second read clock signal when said bypass read operation is indicated.

6. The bypass system of claim 3, wherein the memory system includes a memory array, further comprising:
an access interface for providing bit line information from the memory array to the differential input of the sense amplifier; and
wherein said local controller provides an access enable signal to an enable input of said access interface.

7. The bypass system of claim 1, further comprising a self test circuit that controls providing said input data value to said bypass latch and that provides a memory read bypass signal to said memory controller to indicate said bypass read operation.

8. A method of performing a bypass read operation that mimics timing of a memory system, comprising:
receiving a bypass enable indicative of the bypass read operation;
disabling a normal read operation of the memory system when the bypass read operation is indicated;
converting an input data value to an input complementary pair when the bypass read operation is indicated;
providing the input complementary pair to a differential input of a sense amplifier of the memory system;
initiating a self-timing circuit of the memory system after the bypass read operation is indicated, wherein the self-timing circuit activates the sense amplifier after a predetermined time period; and
converting, by the sense amplifier upon activation, the input complementary pair to an output data value.

9. The method of claim 8, further comprising:
providing the input data value to a data input of the memory system; and
providing the bypass enable, by a self test circuit, to initiate the bypass read operation.

10. The method of claim 8, further comprising latching the output data value into a register.

11. The method of claim 8, wherein said disabling a normal read operation includes disabling access logic having an input coupled to a memory array of the memory system and an output coupled to the differential input of the sense amplifier.

12. The method of claim 8, wherein said converting an input data value to an input complementary pair comprises:
enabling a latch having an input receiving the input data value when the bypass read operation is indicated; and
latching, by the latch after being enabled, the input data value to the input complementary pair.

13. The method of claim 12, wherein said providing the input complementary pair to a differential input of a sense amplifier comprises enabling a driver having an input coupled to an output of the latch and having an output coupled to the differential input of the sense amplifier.

14. The method of claim 12, further comprising clocking the latch synchronous with a read clock of the memory system.

15. The method of claim 8, wherein said initiating a self-timing circuit of the memory system comprises providing an internal clock synchronous with a read clock of the memory system to initiate the self-timing circuit.

16. A memory system with a bypass system, comprising:
a memory controller that provides a bypass enable and a bypass read signal in response to a bypass read indication, and that provides at least one disable signal to disable a normal read operation in response to said bypass read indication;
a bypass latch that, when enabled by said bypass enable, latches and converts an input data value into a corresponding input complementary pair;
a self-timing circuit that provides a sense signal upon expiration of a predetermined time period that starts when said bypass read signal is provided; and
a sense amplifier that evaluates said input complementary pair provided by said bypass latch when initiated by said sense signal and that provides an evaluated output data value indicative of said input data value.

17. The memory system of claim 16, wherein said bypass latch comprises:
an input latch having a data input receiving said input data value, an enable input receiving said bypass enable, and an output providing a corresponding complementary bit pair when said bypass enable is provided; and
a data driver that drives said corresponding complementary bit pair as said input complementary pair to a differential pair input of said sense amplifier.

18. The memory system of claim 17, wherein said memory controller provides a driver enable signal to an enable input of said data driver in response to said bypass read signal being provided.

19. The memory system of claim 16, further comprising:
an access interface having an output providing a differential bit pair from a memory array to a differential input pair of said sense amplifier when said output is enabled during a read operation; and
wherein said at least one disable signal provided by said memory controller disables said output of said access interface in response to said bypass read signal being provided.

20. The memory system of claim 16, further comprising a self test circuit that controls providing said input data value to said bypass latch and that provides said bypass read indication to said memory controller to disable said normal read operation and to initiate a bypass read operation.

\* \* \* \* \*